United States Patent [19]

Charette

[11] 4,292,585
[45] Sep. 29, 1981

[54] LEAKAGE CURRENT TESTING CIRCUIT

[76] Inventor: George F. Charette, 14 Skelton Rd., Burlingto, Mass. 01803

[21] Appl. No.: 4,322

[22] Filed: Jan. 17, 1979

[51] Int. Cl.³ .......................................... G01R 31/02
[52] U.S. Cl. ............................................ 324/51; 324/66
[58] Field of Search ........................ 324/51, 54, 66; 340/515, 516; 361/45, 58

[56] References Cited

U.S. PATENT DOCUMENTS

| | | | |
|---|---|---|---|
| 3,784,903 | 1/1974 | Thomas | 324/51 |
| 3,878,458 | 4/1975 | Muska | 324/51 |
| 3,898,557 | 8/1975 | Strock | 324/51 |
| 4,135,129 | 1/1979 | Johnston et al. | 324/51 |

Primary Examiner—David K. Moore

[57] ABSTRACT

A three wire leakage current testing circuit for determining the operational performance of ground fault circuit interrupter devices has parallel tripping leads connected to the output of a potentiometer adjustable to line voltage. One lead includes resistors, a potentiometer adjustable within a selected milliampere range and a milliammeter. The other lead has a timer the readout of which is digital and in terms of milliseconds. The leads are switch controlled so that one lead may be closed independently of the other or both leads may be closed simultaneously. The testing circuit may be plugged into or connected to an energized ground fault interrupter receptacle or circuit breaker and it includes switch controlled leads in which an external ground fault circuit interrupter device may be incorporated, the testing circuit then plugged into a conventional three wire outlet. The circuit also includes a section enabling other tests to be made such as voltage, polarity, circuit ground resistance and leakage tests to be made of a portable tool.

6 Claims, 2 Drawing Figures

LEAKAGE CURRENT TESTING CIRCUIT

BACKGROUND OF THE INVENTION

Ground fault circuit interrupters are widely used in some installations as required by OSHA and the National Electric Code. The Underwriters' Laboratories, Inc. has established the performance standard for Class A ground fault circuit interrupters as having trip level of no more than 5 milliamperes within an equated and established period of time. Thus "the duration in time of ground fault shock should be limited to be within the range of normal human endurance".

The need for testing circuit interrupters has been established by testing a substantial number of them and in some instances there have been failures to trip at all, with others tripping occurred at too low or too high a milliampere reading or trips occured after a prolonged period of time, and in some instances their operation was too erratic. If ground fault circuit interrupters do not perform as specified they obviously present unsafe hazardous conditions to personnel.

Testing equipment is presently available but as far as I am aware these provide information as to leakage current only in terms of milliamperes. My testing of Class A interrupters has resulted in finding instances where, while the milliampere readings are within the specified range, there is a wide range of deviations of tripping time in terms of milliseconds, in some cases, in a clearly unsafe range. As far as I am aware, there are no references pertinent to this invention.

The Present Invention

The general objective of the present invention is to provide a safe testing circuit for ground fault circuit interrupter devices providing information as to their performance as to leakage current in terms of milliamperes and tripping time in milliseconds.

In accordance with the invention, this objective is attained with a three wire leakage current testing circuit that is to be connected to an energized three wire, 120 Volt circuit. The testing circuit has a potentiometer adjustable to the determined line voltage thus to be capable of adjusting the voltage of the test to complement the line voltage of the circuit. The adjusted output of the potentiometer is connected to a pair of parallel tripping leads. One lead includes parallel resistors, a potentiometer adjustable in a milliampere range, and a milliammeter. The other lead includes a conventional timer of the type having a digital readout which is in terms of milliseconds and in which the reading is locked when the device being tested trips.

In one use of the testing circuit, it is plugged into an energized ground fault circuit interrupter receptacle or circuit breaker circuit that is to be tested first in terms of milliamperes, preferably by plural, successive tests averaged to determine the tripping value. Then with the milliampere potentiometer left at that value, both leads are closed simultaneously by a common test switch to determine the leakage time in terms of milliseconds, preferably by plural successive tests, at the predetermined milliampere value.

The millimeter potentiometer is then set at five milliamperes and both leads closed and the tripping time noted. Desirably this test is then repeated twice and the results averaged. The ground fault circuit interrupter being tested is operating within specifications if the tripping value is in the 25–40 milliseconds range or less.

For another use, the testing circuit includes a test section between the line voltage potentiometer and the parallel tripping leads into which a ground fault circuit interrupter device to be tested can be incorporated, the testing circuit then plugged into a conventional energized three wire 120 Volt outlet and the leakage testing carried out as above stated as the test section now is between the line voltage potentiometer and the tripping leads.

In the preferred embodiment of the invention, both uses are permitted with switch means that enable the adjusted output of the line voltage potentiometer to be connected directly to the parallel tripping leads or indirectly through the test section.

Another objective of the invention is to enable the circuit to be used in making other tests including voltage, polarity, ground resistance and leakage testing of portable tools, an objective attained with the testing circuit including first and second sections, the first of which includes a ground fault circuit interrupter known to operate within specifications and an additional means enabling other tests to be made and the second section the circuitry used in determining leakage in terms of milliamperes.

Other objectives, novel features and advantages of the invention will be apparent from the accompanying specification and appended claims.

BRIEF DESCRIPTION OF THE DRAWINGS

The accompanying drawings illustrate schematically a preferred embodiment of the invention

THE PREFERRED EMBODIMENT OF THE INVENTION

Figure 1:
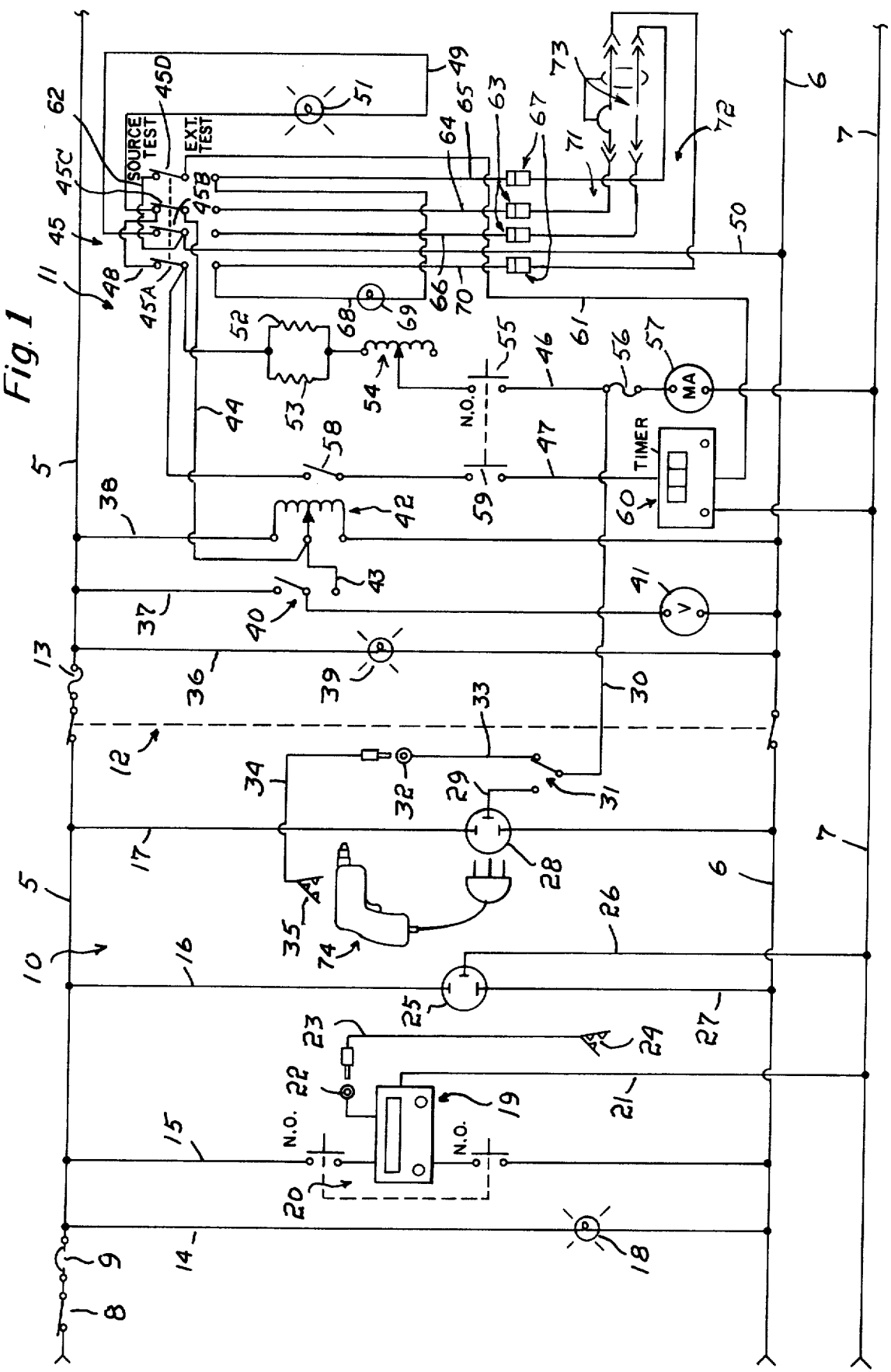
FIG. 1 is a schematic showing of the circuit with the switch means set for use when the energized source to which the circuit is connected is a ground fault circuit interrupter device to be tested.

The three wire testing circuit illustrated by the drawings has lines 5, 6, and 7 connectable to an energized 120 Volt outlet with the line 5 the "hot" line and provided with a switch 8 and a suitable circuit breaker 9 such as a 15 ampere circuit breaker. The line 6 is a neutral line and the line 7, the ground line.

The circuit includes a first section generally indicated at 10 and a second section, generally indicated at 11 and connected to the first section by switch means 12 when closed. The switch means 12 controls the lines 5 and 6 to the second section and is indicated as being of the two-pole, single-throw type. The second section is desirably protected by a three ampere fuse 13.

The first section has parallel leads 14, 15, 16, and 17 connecting the lines 5 and 6 via various devices. The lead 14 is provided with a lamp 18 to show when the test device is energized and the lead 15 includes a conventional polarity and resistance test unit 19 having a normally open two-pole switch 20, a ground lead 21 connected to the line 7 and a ground reference jack 22 to receive the ground reference lead 23 shown as having a clamp 24 and for use in ground resistance testings. The lead 16 has a conventional ground fault circuit interrupter 25 known to operate within specifications, with its lead 26 connected to the ground line 7 and its lead 27 connected to the line 6. The lead 17 has a test receptacle 28 having a lead 29 connectable to a leakage test lead 30 by a single pole, double-throw switch 31 in the first operative position thereof. A jack 32 in a lead 33 is connected to the lead 30 in the second operative position of the switch 31 and is for use when a ground test lead 34, provided with a clamp 35, is plugged into the jack 32. The leakage test lead 30 is connected to a milliammeter 57 in the second section 11.

The second circuit section 11 has a series of three parallel leads 36, 37, and 38 between the lines 5 and 6. The lead 36 has a lamp 39 to show when the section 11 is energized. The lead 37 has a switch 40, shown as a single-pole, double-throw type, and a voltmeter 41 and the lead 38 has a test voltage potentiometer 42 adjustable in a range of from 0–150 Volts.

The potentiometer 42 has leads 43 and 44 for its adjusted output with the lead 43 connected to the voltmeter 41 when the switch 40 is in its second operative position.

The second circuit section 11 has switch means, generally indicated at 45 and shown as of a four single-pole, doublethrow type to be operated together and detailed as having switches 45A, 45B, 45C, and 45D of a single-pole, double-throw type with the first operative position of each used in source testing and the second operative position of each used in effecting external tests of a ground fault circuit interrupter device when incorporated in the test circuit in a subsequently detailed manner.

In the first or source test position of the switch means 45, the lead 44 from the potentiometer 42 is connected to tripping leads 46 and 47 by the switch 45C and via a connecting lead 48 and the switch 45A. The switch 45C also connects a lead 49, via the switch 45B and a lead 50 to the line 6. The lead 49 has a lamp 51 to show when the second circuit section 11 is energized for source testing.

The lead 46 includes parallel resistors 52 and 53, a potentiometer 54, adjustable in the milliampere range provided by the resistors and for use where Class A ground fault circuit interrupter devices are to be tested, a momentary, normally open single pole, pushbutton switch 55, a three ampere fuse 56 and a milliammeter 57 and is connected to the ground line 7. The leakage test line 30 from the section 10 is connected to the fuse 56 and milliammeter 57. In practice, the potentiometer 54 is adjustable in 0–10 milliamperes. The value of the resistors 52 and 53 is 24,000 ohms ±5%.

The lead 47 has a switch 58, a normally open, single pole switch 59 mechanically connected to the switch 55 to be opened and closed therewith, and a battery operated timer 60 of a digital readout type operating within a 0–999 millisecond range with its readout locked when a trip occurs and is connected to the ground line 7. A timer lead 61 is closed to the lead 50 to the line 6 by the switch 45D in its first position via a connecting lead 62.

Figure 2:
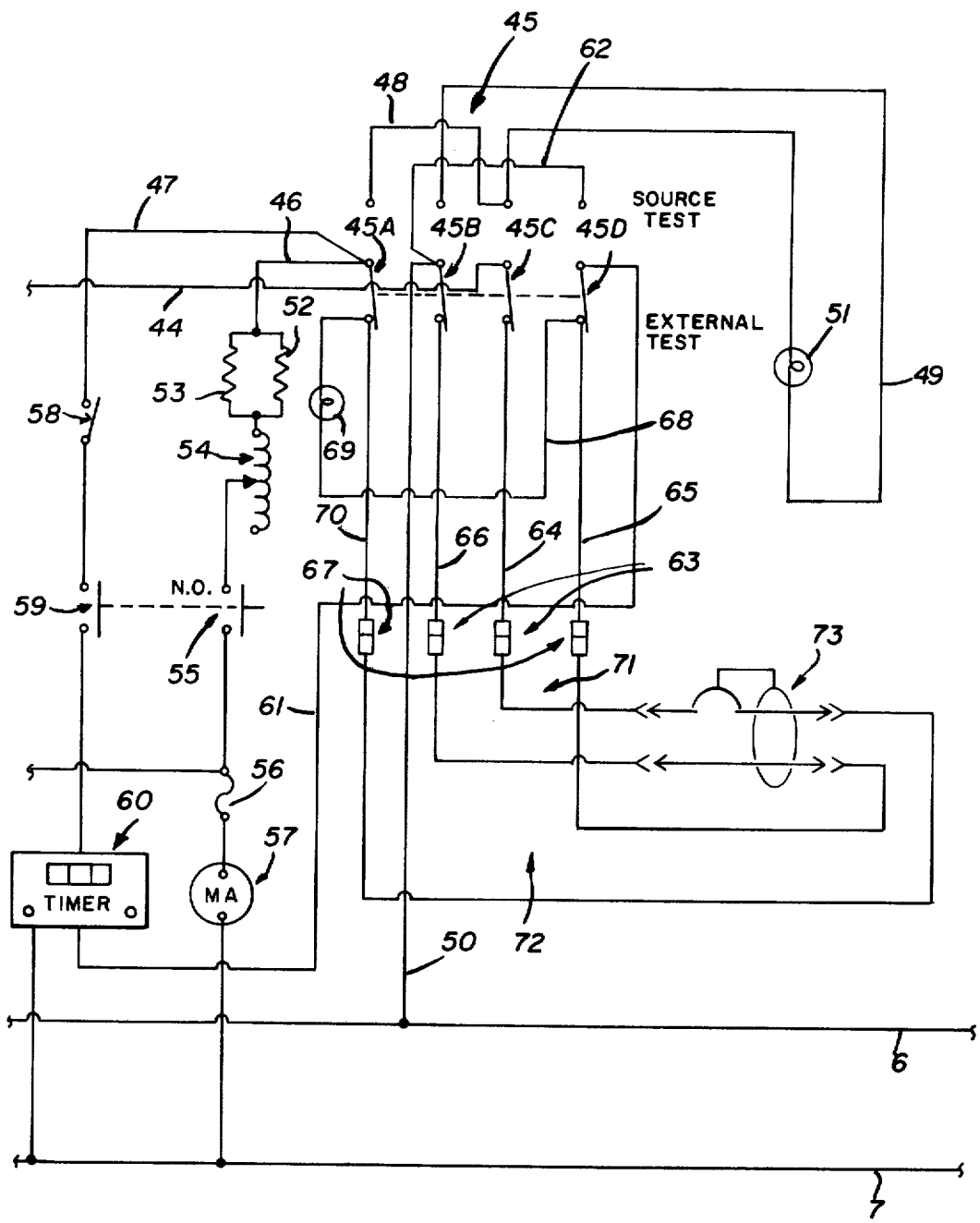
FIG. 2 is a schematic showing of part of the circuit with the switch means set to enable a ground fault circuit interrupter device to be incorporated in the test circuit.

The second position of the switch means 45 is illustrated by FIG. 2. The external test section of the test circuit includes a line side receptacle having leads 64 and 66 connected thereto. The lead 64 is connected to the potentiometer output lead 44 by the switch 45C when in its second position and the lead 66 is connected to the line 6 by the switch 45B. The external test section also includes a load side receptacle 67 having leads 65 and 70 connected thereto. The lead 65 is connected to the line 70 via the branch 68 provided with a lamp 69.

The branch 68 is connected to the tripping leads 46 and 47 in the second position of the switch 45A. The lead 65 is also connected to the timer lead 61 when the switch 45D is in its second position.

Cords 71 and 72 are provided for use when an external test is to be made, the cord 71 to be plugged into the line side receptacle 63 and connected to both line side terminals of a de-energized device 73 such as a ground fault circuit interrupter to be tested and the cord 72 to be plugged into the load side receptacle 67 and connected to both load side terminals of the device 73.

In use for source testing of a ground fault circuit interrupter device, with the switches 9 and 12 open, the circuit is connected to the energized ground fault circuit interrupter device (not shown) and the switch 9 is then closed. The ground reference cord 23 is then plugged into the jack 22 and clamped to establish a ground reference point. The switch 20 is then closed and the lamp Y, if it then lights, shows that polarity is correct and the ground resistance meter reads satisfactorily and the test may be continued.

The switch 12 is then closed and with the switch 40 in its line voltage position the line voltage is noted on the voltmeter 41. The switch 40 is then set in its second or test voltage position and the potentiometer 42 adjusted so that its output voltage matches the actual line voltage.

The switch means 45 is then set to place its several switches in their first or source testing positions, see FIG. 1. The operator then closes the switches 55 and 59 (as the switch 58 is now open, the timer 60 is not started) and the potentiometer 54 in the lead 46 is then slowly adjusted until the ground fault circuit interrupter being tested trips and the milliampere reading at which the tripping occurred is noted. It should be noted that plural testing for milliampere leakage is desirable. A total of three tests is recommended with their readings averaged.

The potentiometer 54 is then left in its trip value position. The timer switch 58 is now closed and with the digital readout of the timer 60 cleared, the switches 55 and 59 are simultaneously closed and the readout at the trip value noted. Desirably, the tests for leakage trip in milliseconds is repeated twice and the readings of the three testings averaged.

The combined milliampere and millisecond leakage tests are again repeated, desirably three times, with the milliampere setting of the potentiometer 54 at 5 milliamperes. If average tripping occurs within the 25–40 milliseconds range or less, then the ground fault circuit interrupter being tested is operating within specifications, otherwise it must be held to be defective.

For an external test, the above procedure is followed except that after the polarity resistance test and before the switch 12 is closed, the cords 71 and 72 are connected to the terminals of the ground fault circuit interrupter device 73 and plugged into the receptacles 63 and 67 and the switch of the device 73 is reset. The switch means 45 is then set for external testing, the switch 12 closed, and the previously described testing is carried out.

In the case of a portable tool test, the tool is, of course, first examined for visible defects and then a conventional continuity test made. The testing circuit is connected to a conventional three wire outlet, with the switch 9 closed, a test is made for polarity and ground resistance. The switch 12 is closed and the line voltage recorded. The switch 12 is then opened. The portable tool 74, an electric drill, for one example, is plugged into the ground fault circuit interrupter 25, and the portable tool energized. If the ground fault circuit interrupter 25 trips, there is a defective tool with high leakage current and the test is discontinued, otherwise the test may be continued by plugging the tool 74 into the receptacle 28. The ground reference cord 34 is then clamped to the motor housing and plugged into the jack 32. The switch 28 is turned to its housing leakage test position and the portable tool 74 is turned on and any leakage current will register on the milliammeter 57. The switch 28 is turned to the ground conductor leakage test position, reference cord 34 disconnected and the portable tool 74 turned on and any leakage current flow in the ground conductor will register on the milliammeter 57.

Leakage current testing circuits in accordance with the invention are well adapted to measure leakage accurately in terms of milliamperes and milliseconds required to trip the ground fault circuit interrupter device. Where the test is of an outlet protected by such a device, the test is effected by influencing the milliampere value at one side thereof, while when the test is to be made of a device to be installed, the test is effected by reducing the milliampere value at one side thereof.

I claim:

1. A leakage current testing circuit to be connected to an energized three wire outlet and for use where either the outlet is protected by a ground fault circuit interrupter device or such a device is to be tested prior to its installation, said testing circuit including three parallel lines of which the second is neutral and the third a ground, first and second parallel leads connecting said first and neutral lines, the first parallel lead including a voltmeter and the second parallel lead a potentiometer adjustable to the prevailing first line voltage and including a lead for the adjusted output, first and second tripping leads connected to the ground line, the first tripping lead including parallel resistors, a potentiometer adjustable in a milliampere range and a milliammeter, and the second tripping lead including a digital readout timer of a type latching its reading when the device being tested trips and a timer lead, first switch means in control of said tripping leads and operable to close them in the alternative or simultaneously, second switch means having first and second operative positions in the first of which the adjusted output lead is closed to said tripping leads and said timer lead is connected to said neutral line, the first position used when the circuit is protected by a ground fault circuit interrupter device to be tested and the second position used when an external test is to be made of such a device prior to its installation, and said circuit including an external test section provided with first and second outlets each of which includes first and second leads to which said device is to be connected, and when said second switch means is in its second position with the device to be tested connected to said leads, the adjusted output lead is closed to the external test section through the device and the tripping leads, and the timer lead closed through the device to the neutral line, whereby in either position of the second switch means, device leakage can be measured in terms of milliamperes and then in terms of milliseconds at an established milliampere value.

2. The testing circuit of claim 1 in which the first switch means includes a test switch in said second tripping lead that is to be closed when a time test is to be made, a normally open switch in each tripping lead, and means operable to close said normally open switches simultaneously.

3. The testing circuit of claim 1 in which said second switch means includes first, second, third, and fourth singlepole, double-throw switches, and means operable to move them to establish said first and second operative positions, in said first operative position, said adjusted output lead connected to said tripping leads through said first and third switches and said timer lead connected to said neutral line through said second and fourth switches, and in said second operative position, said adjusted output lead is connected through said device to said tripping leads through said third and first switches and said timer lead is connected through said fourth and second switches.

4. The testing circuit of claim 3 and means to operate said first, second, third, and fourth switches simultaneously.

5. The testing circuit of claim 3 and a lead including a first lamp and connected to said adjusted output lead by said third and first switches in said operative position and a lead including a second lamp and connected to said adjusted output lead by said first and third switches in said second operative position.

6. The testing circuit of claim 1 in which there is a three wire outlet to enable a device such as a portable tool to be operated, a first lead connected to said outlet to the first line, a second lead connected to the outlet to the neutral line, and a third lead, a fourth lead to which the device is to be connected for leakage, a test lead connected to said first tripping lead between said first switch means and said milliammeter, and a switch operable to connect said third outlet lead or said fourth lead to said test lead.

* * * * *